(12) United States Patent
Hester et al.

(10) Patent No.: US 11,879,524 B1
(45) Date of Patent: *Jan. 23, 2024

(54) ACTUATOR SYSTEMS AND METHODS

(71) Applicants: C. Anthony Hester, Huntsville, AL (US); Charles F. Hester, Huntsville, AL (US)

(72) Inventors: C. Anthony Hester, Huntsville, AL (US); Charles F. Hester, Huntsville, AL (US)

( * ) Notice: Subject to any disclaimer, the term of this patent is extended or adjusted under 35 U.S.C. 154(b) by 18 days.

This patent is subject to a terminal disclaimer.

(21) Appl. No.: 17/229,727

(22) Filed: Apr. 13, 2021

Related U.S. Application Data

(60) Continuation of application No. 16/203,344, filed on Nov. 28, 2018, now Pat. No. 11,002,347, which is a division of application No. 15/076,347, filed on Mar. 21, 2016, now Pat. No. 10,167,933.

(60) Provisional application No. 62/136,284, filed on Mar. 20, 2015, provisional application No. 62/136,264, filed on Mar. 20, 2015.

(51) Int. Cl.
| | |
|---|---|
| *G02B 26/00* | (2006.01) |
| *B81B 3/00* | (2006.01) |
| *G02B 26/08* | (2006.01) |
| *F16H 21/06* | (2006.01) |
| *F16H 21/44* | (2006.01) |

(52) U.S. Cl.
CPC ............ *F16H 21/06* (2013.01); *B81B 3/0037* (2013.01); *F16H 21/44* (2013.01); *G02B 26/001* (2013.01); *G02B 26/0833* (2013.01); *B81B 2201/042* (2013.01); *B81B 2203/053* (2013.01); *B81B 2207/053* (2013.01)

(58) Field of Classification Search
CPC ....... F16H 21/16; F16H 21/44; B81B 3/0037; B81B 2201/042; B81B 2203/053; B81B 2207/053; G02B 26/001; G02B 26/0833
See application file for complete search history.

(56) References Cited

U.S. PATENT DOCUMENTS

| | | | |
|---|---|---|---|
| 5,311,360 | A | 5/1994 | Bloom et al. |
| 5,459,610 | A | 10/1995 | Bloom et al. |
| 5,510,824 | A | 4/1996 | Nelson |
| 5,677,783 | A | 10/1997 | Bloom et al. |
| 6,552,842 | B2 | 4/2003 | Simpson et al. |

(Continued)

OTHER PUBLICATIONS

Mastrangelo, C.H., "Suppression of Stiction in MEMS," Center for Integrated Microsystems, Department of Electrical Engineering and Computer Science, University of Michigan, pp. 1-12.

(Continued)

*Primary Examiner* — Jake Cook
(74) *Attorney, Agent, or Firm* — Maynard Nexsen PC; Brian T. Sattizahn

(57) ABSTRACT

An actuator system can be used to adjust a position of a component in a spatial light modulator. The actuator system has a pair of actuators that are coupled together by a frame that is used to adjust the height of the component relative to the substrate. The frame includes a pair of moment arms that are coupled to the actuators and a pair of connecting arms that are coupled to the moment arms. The connecting arms are then connected together at about the center of the frame, which portion of the frame can be used to raise or lower the plate. The center of the frame can be raised or lowered by a shortening or lengthening of the connecting arms relative to each other.

6 Claims, 5 Drawing Sheets

(56) References Cited

U.S. PATENT DOCUMENTS

| | | |
|---|---|---|
| 6,618,187 B2 | 9/2003 | Dilossof |
| 6,661,637 B2 | 12/2003 | McIntosh et al. |
| 6,856,448 B2 | 2/2005 | Fitzpatrick et al. |
| 7,027,161 B2 | 4/2006 | Trisnadi et al. |
| 10,088,670 B1 | 10/2018 | Hester et al. |
| 10,167,933 B1 | 1/2019 | Hester et al. |
| 10,209,511 B2 | 2/2019 | Hester et al. |
| 2003/0015768 A1 | 1/2003 | Bosco et al. |
| 2004/0036950 A1 | 2/2004 | Hunter et al. |
| 2004/0212026 A1 | 10/2004 | Van Brocklin et al. |
| 2006/0115920 A1 | 6/2006 | Urano et al. |
| 2008/0055704 A1 | 3/2008 | Neidrich |
| 2009/0127639 A1 | 5/2009 | Suzuki et al. |
| 2009/0206052 A1 | 8/2009 | Maeda |
| 2012/0184067 A1 | 7/2012 | Shi |
| 2012/0200906 A1 | 8/2012 | Wu |
| 2014/0036344 A1 | 2/2014 | Wakai |
| 2014/0184573 A1 | 7/2014 | Nemchuk |
| 2015/0070749 A1 | 3/2015 | McDonald |
| 2017/0176740 A1 | 6/2017 | Barron |
| 2018/0045393 A1 | 2/2018 | Yagi |

OTHER PUBLICATIONS

Kim, S., et al., "MEMS for Optical Functionality", Journal of Electroceramics, 2004, vol. 12, pp. 133-144.

Hester, et al., U.S. Appl. No. 16/203,344, entitled, "Actuator Systems and Methods," filed Nov. 28, 2018.

ACTUATOR SYSTEMS AND METHODS

CROSS REFERENCE TO RELATED APPLICATIONS

This application is a continuation of U.S. patent application Ser. No. 16/203,344, entitled, "Actuator Systems and Methods," filed on Nov. 28, 2018, which is incorporated herein by reference. U.S. application Ser. No. 16/203,344 is a divisional to U.S. Pat. No. 10,167,933, entitled, "Actuator Systems and Methods," and filed on Mar. 21, 2016, which is incorporated herein by reference. U.S. Pat. No. 10,167,933 claims priority to U.S. patent application Ser. No. 62/136,284, entitled "Interference-Based Broad Band Spatial Light Modulator" and filed on Mar. 20, 2015, and U.S. patent application Ser. No. 62/136,264, entitled "MEMS Linear Actuator Throw Enhancement Mechanism" and filed on Mar. 20, 2015, both of which are incorporated herein by reference.

BACKGROUND

A typical spatial light modulator (SLM) can be created using microfabrication techniques and can modulate light by moving micromirrors. An SLM can modulate light beams using amplitude modulation, phase modulation or a combination thereof. Often SLMs are used as a component of a laser printer or other display devices, such as a projector. The performance specifications of an SLM are generally dependent on its application.

A conventional SLM that modulates light typically has a reflective deformable grating wherein the deformation of the grating is controlled electronically. The grating has one or more elongated elements with a light reflective planar surface. In addition, the grating serves as an electrode for receiving a control signal. The elongated elements extend from a fixed support structure or may be cantilever beams that are pulled by electric field forces generated by the control signal. Details of one such conventional SLM are described in U.S. Pat. No. 5,311,360, "Method and Apparatus for Modulating a Light Beam," issued on May 10, 1994.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

Figure 1:
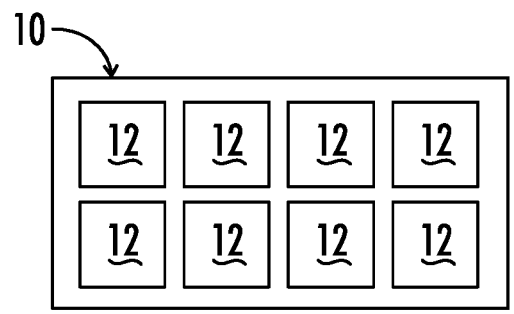
FIG. 1 depicts an embodiment of a spatial light modulator system with an array of pixels.

A spatial light modulator (SLM) includes an array of modulation elements, or pixels, for independently and dynamically changing the properties of the reflected and/or transmitted light at each pixel. The present disclosure is directed to an SLM that modulates light by moving semi-reflective (SR) or reflective surfaces in relation to one another. Light enters a cavity between at least two of the surfaces and reflects back-and-forth between the surfaces causing constructive and destructive interference within the cavity. Changing the distance between such surfaces, referred to as "cavity length," changes the interference characteristics. For a particular wavelength of light, the cavity length establishes the amount interference that occurs within the cavity. Thus, changing the separation distance of the surfaces modulates the light. Forming an array of these modulators creates an interference-based spatial light modulator (SLMI).

Thus, in one embodiment of the disclosure, an SLMI employs electromagnetic interference between surfaces to modulate the intensity and/or phase of the transmitted and/or reflected light from the surfaces. The SLMI allows small movement of the surfaces, a fraction of the light wavelength, to affect changes in the transmitted and/or reflected properties of the light. While this method of modulation works for all wavelengths of light, it proves particularly useful at longer wavelengths. Modulating long wavelengths with small movements allows the creation of high frame rate, low power SLM's for the longer wavelengths, such as those found in the millimeter-wave (mmW) and terahertz (THz) bands.

An SLM system in accordance with one embodiment of the present disclosure uses electromagnetic modulation structures at each pixel to employ electromagnetic interference to modulate the intensity and/or phase of the transmitted and/or reflected light from the pixel. The use of the modulation structures enables the independent and dynamic changing of the properties, e.g., intensity and/or phase, of the reflected and/or transmitted light at each pixel. The modulation structure can incorporate a plate with a semi-reflective surface that is separated from a substrate having either a reflective or semi-reflective surface. The modulation structure can have one or more actuators positioned between the substrate and the plate to control the separation distance between the plate and the substrate. By controlling the distance between the plate and the substrate, the amount of light reflected by and/or transmitted through the surfaces of the plate and substrate can be controlled.

As will be described in more detail hereafter, exemplary embodiments of SLM systems have semi-reflective components, e.g., plates, and electromechanical components, e.g., actuators, for moving the semi-reflective components relative to a reflective or semi-reflective substrate. Both the semi-reflective components and the electromechanical components can be formed using known microfabrication techniques. The semi-reflective components can be moved in response to voltages of a control signal applied to the actuators.

The semi-reflective components may function as an element of a pixel, wherein multiple pixels form of an optical device that may display information or transfer light energy to other elements of an optical system. Each actuator provides forces, in response to a control signal, for a generally linear movement of the semi-reflective components, and the linear movement causes the semi-reflective components to modulate the incoming light beam. The modulation may be amplitude (intensity) modulation, phase modulation or a combination thereof. Each semi-reflective component can be moved separately to allow for independent control of phase modulation and amplitude modulation. That is, phase modulation may be controlled independently relative to amplitude modulation.

The present disclosure also generally pertains to an actuator system that can be used to adjust a position of a component. As an example, the actuator system may be used with each pixel of an SLM system to adjust the height of the plate of a pixel relative to the substrate. The actuator system can provide an increased linear movement (or throw) and, thus, an increased movement distance (e.g., the separation distance between the plate and the substrate of a pixel). The actuator system has a pair of actuators that are coupled together by a frame that is used to adjust the height of the plate relative to the substrate. The frame includes a pair of moment arms that are coupled to the actuators and a pair of connecting arms that are coupled to the moment arms. The connecting arms are then connected together at about the center of the frame, which portion of the frame can be used to raise or lower the plate. The center of the frame can be raised or lowered in a "scissor-like" manner by a shortening (moving together) or lengthening (moving apart) of the connecting arms relative to each other. The shortening or lengthening of the connecting arms occurs from the tandem movement of the moment arms by the actuators, which moment arms are connected to the connecting arms.

An embodiment of an actuator used in the actuator system includes a substrate for supporting components of the actuator. The actuator can have a drive (torsion) bar having one or more edges for receiving forces for rotating the drive bar about its axle of rotation. In one embodiment, the actuator further includes a force ribbon attached to the substrate and contacting one or more edges of the drive bar, wherein the force ribbon creates forces in response to a control signal. The actuator has one or more conductive elements (e.g., control plates) that generate electric fields in response to voltages of the control signal. The electric fields create Coulomb forces on the force ribbon, and such forces are time-varying forces when the control signal has time-varying voltages. Forces generated by the control signal are transferred from the actuator to the frame of the actuator system and then to the plates coupled to the actuator system.

In one embodiment, an SLM system modulates a light beam by moving semi-reflective components in response to forces from an actuator system, which has a frame providing the actuator forces in response to a control signal. The frame, structurally coupling the actuator system to the semi-reflective components, translates the forces from the actuator system to forces that position and reposition the semi-reflective components.

FIG. 1 depicts a top view of an embodiment of an SLM system 10 with an array of pixels 12. The array of the SLM system 10 as shown in FIG. 1 has a 2 by 4 grid of pixels 12. In other embodiments, the array of the SLM system 10 can have different arrangements with different numbers of pixels 12. Each pixel 12 may be individually controlled by a separate controller (not shown in FIG. 1) for that pixel 12. An example of a controller that can be used to control a pixel is described in U.S. patent application Ser. No. 14/023,119, entitled "Spatial Light Modulator for Actuating Microelectromechanical Systems (MEMS) Structures" and filed on Sep. 10, 2013, which application is incorporated herein by reference. In other embodiments, a single controller can be used to control multiple pixels 12.

Figure 2:
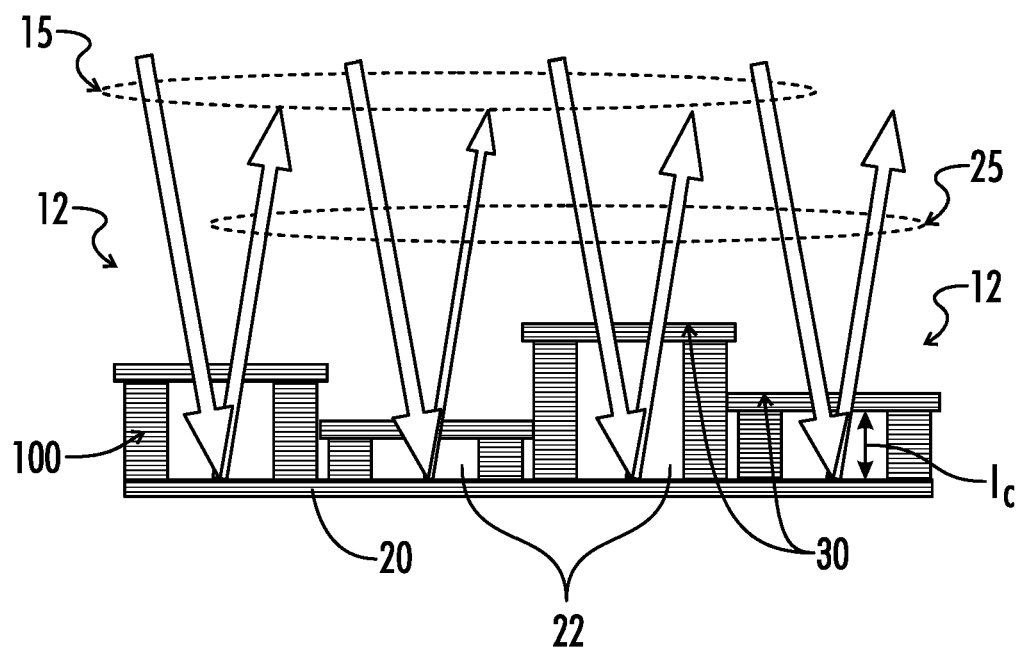
FIG. 2 depicts an arrangement of pixels for the spatial light modulator system of FIG. 1.

FIG. 2 depicts a side view of an exemplary arrangement of pixels 12 for the spatial light modulator system 10 to modulate the intensity of reflected light. It is to be understood that references to "light" in the disclosure can include both visible light having wavelengths of about 400 nm to about 700 nm and other types of electromagnetic radiation (EMR), including, but not limited to, ultraviolet radiation, infrared radiation, microwaves and radio waves, having wavelengths greater than or less than those associated with the visible light range. The embodiment shown in FIG. 2 provides a reflective etalon version of a system 10. Each of the adjacent pixels 12 in the arrangement includes at least one surface element 30 separated from a substrate 20 by a cavity 22. For each pixel, the separation distance between the surface element 30 and the substrate 20, referred to as "cavity length," can be controlled by one or more actuators 100.

The actuator(s) 100 can move quickly and precisely in response to a control parameter, such as an applied voltage, to set the position of the surface element 30 relative to the substrate 20. The actuator(s) 100 can have local circuitry to implement a closed loop control system to set the position of the surface element 30 in proportion to a control voltage. The actuator(s) 100 for the pixel 12 can be mounted on the substrate 20 and can have a frame or other mechanism in contact with or attached to the surface element 30 to adjust the distance between the surface element 30 and the substrate 20, and thereby adjust the cavity length to form an adjustable cavity or etalon 22. Various types of actuators 100 can be used in order to move a surface element 30. U.S. patent application Ser. No. 14/023,119 describers various exemplary actuators that can be used, but other types of actuators are possible in other embodiments.

The surface element 30 of each pixel 12 is independently movable with respect to the surface elements 30 of the other pixels 12. The movement of a surface element 30 may result in the amplitude modulation and/or phase modulation of a light beam impinging on the surface element 30 of the pixel 12. In one embodiment, the surface element 30 can be a plate with a substantially flat or planar surface. However, in other embodiments, the surface element 30 can have other types of structures. For simplicity of illustration, the surface elements 30 will be referred to as "plates" hereafter, but it should be emphasized that other types of surface elements 30 are possible in other embodiments.

Each plate 30 can be made of semi-reflective material to permit a portion of incident light 15 impinging on the plate 30 to pass through the plate 30 and into the pixel's cavity 22. The incident light 15 can be directed from a single source (not shown) and can include light beams having approximately the same magnitude and phase when they strike the semi-reflective material of plate 30. In one embodiment, the semi-reflective material of the plate 30 can be a semi-transparent or semi-translucent material, but can be other materials in different embodiments. The incident light 15 that does not pass through plate 30 is reflected from the surface of the plate 30. The light that enters the cavity 22 can then be reflected off of a reflective surface of substrate 20. In one embodiment, the substrate 20 can be a mirror or micromirror. It is also possible for the substrate 20 to be semi-reflective where a portion of the light passes through the substrate 20, as will be described in more detail below. Light within the cavity 22 reflects back-and-forth between the plate 30 and the substrate 20 with some of the light escaping the cavity 22 through the plate 30. For simplicity of illustration, the light escaping through the plate 30 will be referred to as "reflected light 25." The portions of incident light 15 reflected from the plate 30 without entering the cavity 22 can be reinforced by the reflected light 25 from the cavity 22, which is in phase with the incident light 15, through constructive interference.

For each pixel 12, the length of the cavity 22 (i.e., the separation distance between the plate 30 and the substrate 20) controls the modulation of the intensity and/or phase of incident light 15 impinging on plate 30. As light is reflected back-and-forth in the cavity 22, constructive and destructive interference occurs. The amount of interference varies across wavelength based on cavity length. In general, constructive interference is near a maximum close to the wavelengths of light that are an integer multiple of the cavity length, and destructive interference is near a maximum close to the wavelengths of light that are one-half of an integer multiple of the cavity length. Thus, changing the cavity length generally changes the amount of interference occurring at each wavelength thereby modulating the light as it passes through the cavity 22.

The light reflected by the arrangement of FIG. 2 can provide a wavefront that is modulated according to the positioning of the plates 30. The arrangement of FIG. 2 may be used to create a multi-pixel hologram, where each pixel 12 is independently modulated with respect to other pixels 12. The arrangement of FIG. 2 may also be used to implement other types of devices, such as band pass filters and notch filters.

Figure 3:
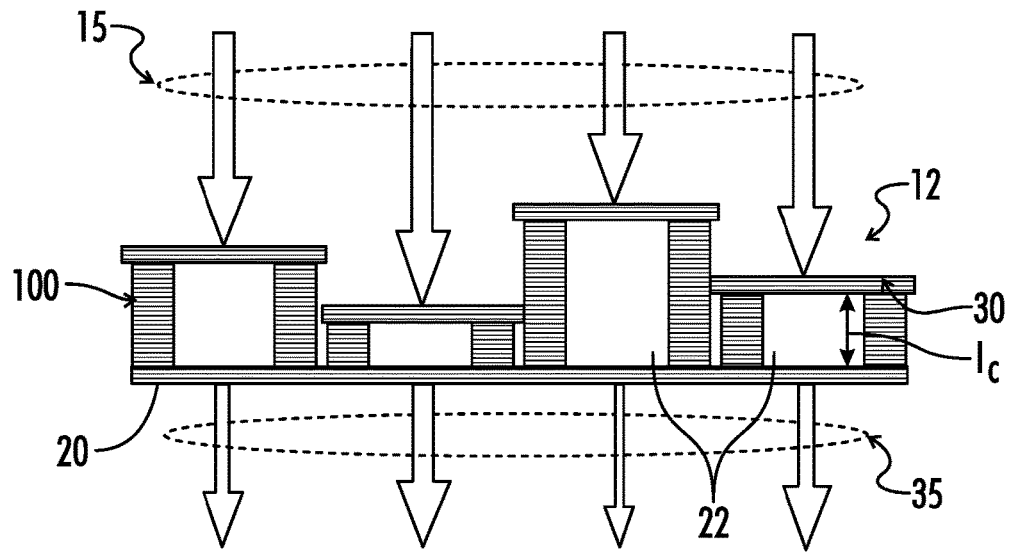
FIG. 3 depicts a second arrangement of pixels for the spatial light modulator system of FIG. 1.

FIG. 3 depicts an exemplary arrangement of pixels 12 for the spatial light modulator system 10 to modulate the intensity of transmitted light. The arrangement of FIG. 3 is similar to the arrangement of FIG. 2 except that the substrate 20 is made of a semi-reflective material instead of having a reflective surface as described in FIG. 2. In one embodiment, the semi-reflective material of the substrate 20 can be a semi-transparent or semi-translucent material, but can be other materials in different embodiments. The use of the semi-reflective material for the substrate 20 permits a portion of the light impinging on the substrate 20 to pass through the substrate 20. Such light will be referred to hereafter as "transmitted light 35." The transmitted light 35 from the substrate 20 can then be used as desired. In one embodiment, the cavity 22 can be a transmissive Fabry-Perot cavity.

In one embodiment, incident light 15 impinges on the SR surface of plate 30, part of the light passes through the surface of plate 30 to the cavity 22, and the remainder of the light reflects from the surface of plate 30. The light passing through the SR surface of plate 30 reflects back-and-forth within in the cavity 22 and experiences interference inside the cavity 22, as described above for the embodiment shown by FIG. 2. The movement of the actuators 100 sets the separation, i.e., the cavity length ($l_c$), between the SR surface of the plate 30 and the fixed SR surface of the substrate 20. Changing the voltage applied to the actuators 100 changes the separation between the SR surfaces of the plate 30 and substrate 20, which modulates the intensity and/or phase of the transmitted light 35. The separation of the plate 30 and the substrate 20 can be selected based on the wavelength of light to be modulated. A small change in the separation of the plate 30 and the substrate 20 permits large modulation, in the reflection or transmission, of the light passing through the cavity 22.

The transmitted light 35 provided by the arrangement of FIG. 3 can provide a wavefront that is modulated according to the positioning of the plates 30. The arrangement of FIG. 3 may be used to create a multi-pixel hologram, where each pixel 12 is independently modulated with respect to other pixels 12. The arrangement of FIG. 3 may also be used to implement other types of devices, such as band pass filters and notch filters.

In the embodiments described above, the substrate 20 is shown as a unitary element from pixel-to-pixel. However, it is possible for pixels to have separate substrates 20, and it is possible for the substrate 20 of one pixel to move with respect to the substrate 20 of another pixel.

Figure 4:
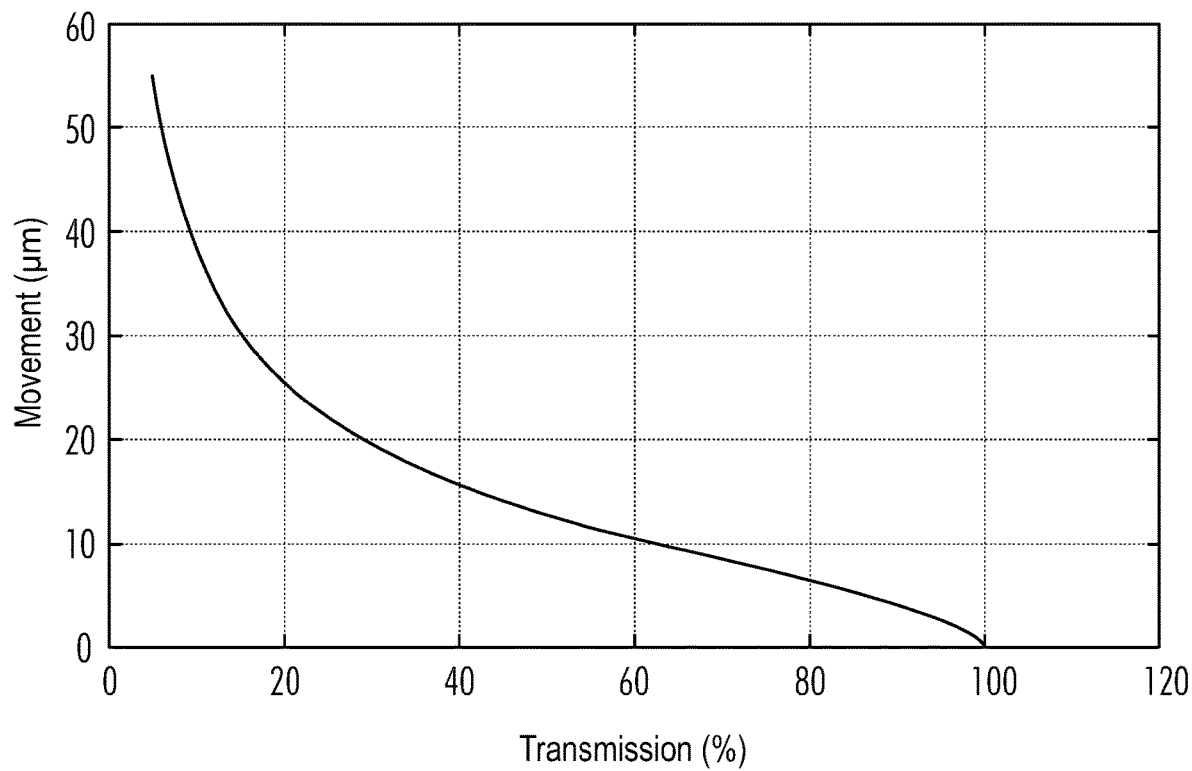
FIG. 4 is a graph showing a relationship between cavity height and light transmission for the spatial light modulator system of FIG. 3.

FIG. 4 is a graph showing a relationship between cavity height and light transmission for the spatial light modulator system 10 of FIG. 3. FIG. 4 shows a simulation of the transmission of light having a wavelength of 3.1 mm through two SR surfaces, e.g., the plate 30 and substrate 20 of FIG. 3, each having about 95% reflectance, as a function of the separation of the surfaces, e.g., the height h shown in FIG. 3. As shown in FIG. 4, the movement of the two SR surfaces by two orders of magnitude less than the wavelength of the light causes significant changes in the intensity of the transmitted light.

Figure 5:
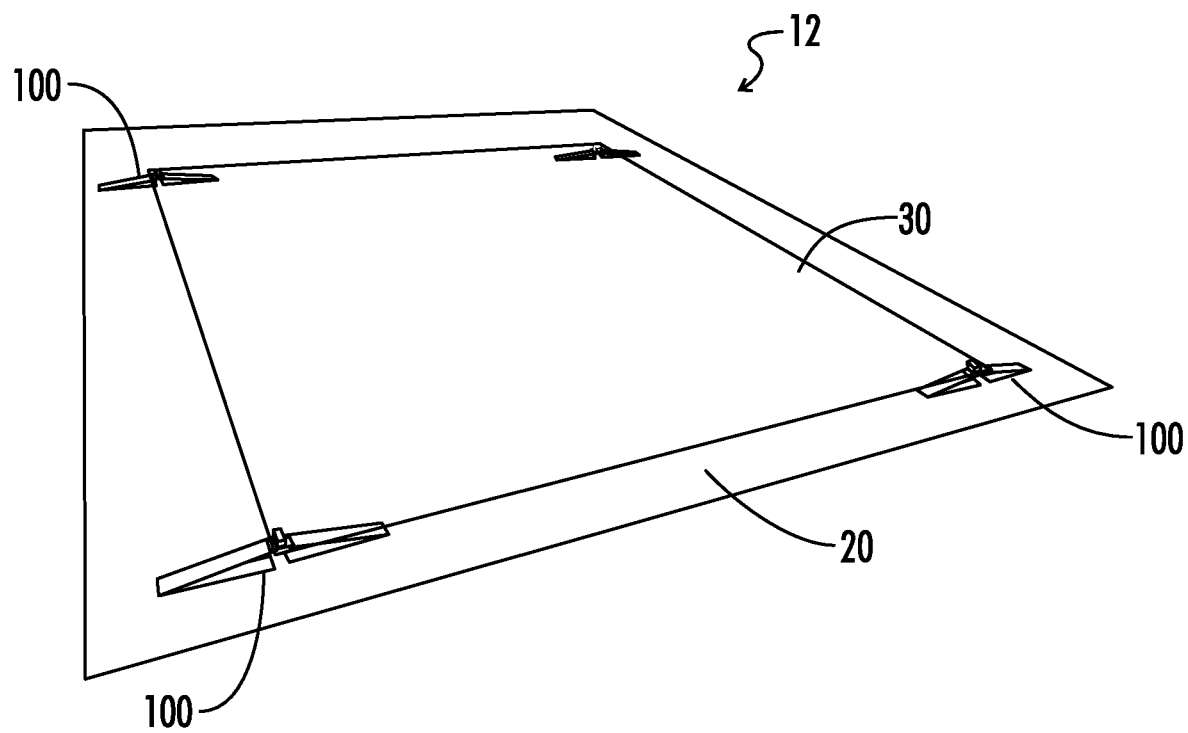
FIG. 5 depicts an embodiment of a pixel for the spatial light modulator system of FIG. 1.

FIG. 5 depicts an embodiment of a pixel 12 for the spatial light modulator system 10. As previously described, the pixel 12 can include a plate 30 separated from a substrate 20 by one or more actuators 100. The actuators 100 can be individually controlled such that the movement of one actuator 100 does not affect the operation of another actuator 100. In another embodiment, one or more actuators can be controlled with a single controller to provide for synchronized movements of the actuators 100. In the embodiment of FIG. 5, an actuator 100 can be placed at each corner of the plate 30. An example of an actuator that can be used with the pixel 12 is described in U.S. patent application Ser. No. 14/023,119, entitled "Spatial Light Modulator for Actuating Microelectromechanical Systems (MEMS) Structures" and filed on Sep. 10, 2013, which application is incorporated herein by reference.

As shown in FIG. 5, an actuator 100 can be placed at each of the corners of the plate 30 and attached to the semi-reflective sheet of material. The placement of the actuators 100 at each of the corners enables the length of the cavity 22 to be more accurately controlled. In addition to controlling the length of the cavity 22, the placement of an actuator 100 at each of the corners of the plate 30 also enables the plate 30 to be tilted or deformed to obtain additional light modulation. For example, actuators 100 at some corners may be raised, while other actuators 100 may be lowered or not adjusted to provide for a cavity 22 where the cavity length varies across the surface of the plate 30.

In one embodiment, the pixel 12 can be used for "beam steering," e.g., reflecting the incident light 15 at a desired angle. As previously discussed, the actuators 100 positioned at the corners of the plate 30 can be controlled to tilt the plate 30 at a predetermined angle relative to the substrate 20. The tilted plate 30 can then be used to direct the light reflecting from the plate 30 in a desired direction and angle based on the predetermined angle of tilt of the plate 30. In another embodiment, the amount of separation between the substrate 20 and the plate 30 can control the range of directions and/or angles for the beam steering. For example, the actuator system 200 (see FIGS. 7-9) can provide a greater range of directions and angles for beam steering than could be obtained from an individual actuator 210 since the linear movement of the actuator system 200 is greater and provides more separation between the plate 30 and the substrate 20. However, it is to be understood that while the use of the actuator system 200 provides increased beam steering capabilities, the use of an individual actuator 210 at each of the corners of the plate 30 can also be used for beam steering by the pixel 12. In still another embodiment, the plate 30 can have a reflective surface instead of a semi-reflective surface to increase the reflection of incident light 15 from the plate 30 and thereby increase the beam steering capability of the pixel 12.

Figure 6:
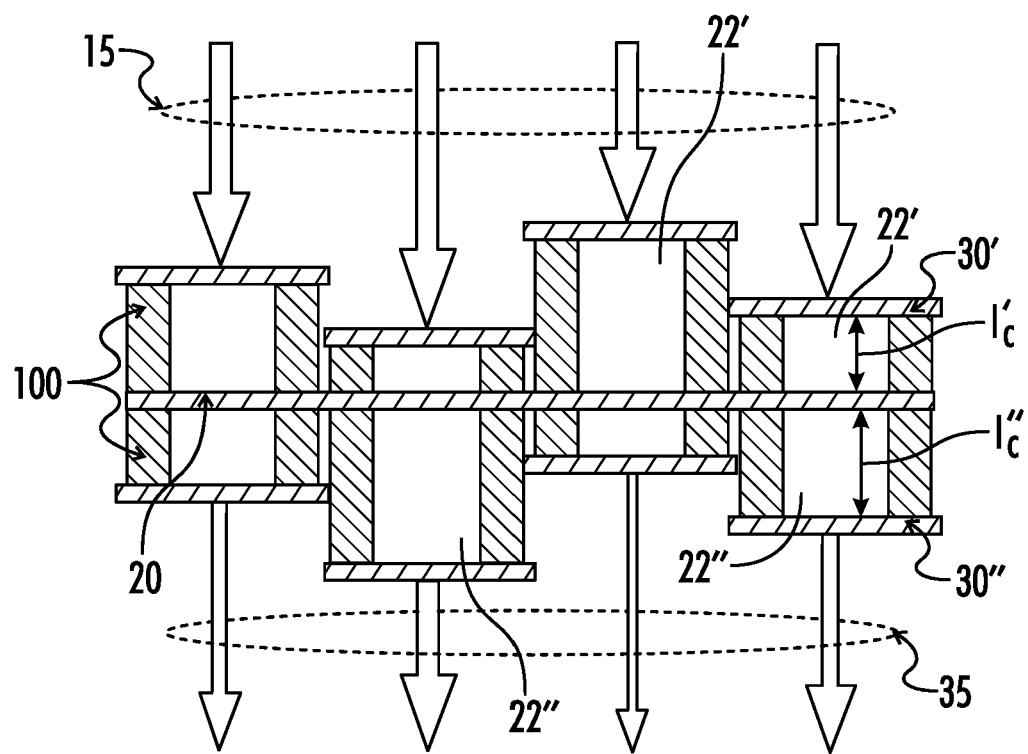
FIG. 6 depicts a third arrangement of pixels for the spatial light modulator system of FIG. 1.

FIG. 6 depicts an exemplary arrangement of stacked cavities 22' and 22" for the spatial light modulator system 10 to modulate the intensity of transmitted light. The embodiment shown in FIG. 6 provides a system 10 that modulates the intensity of the transmitted light using stacked transmissive Fabry-Perot cavities 22' and 22". As shown in FIG. 6, for each pixel 12, light passes through two Fabry-Perot cavities 22' and 22". The use of two cavities 22' and 22" allows smaller movements of the SR surfaces of plates 30 to have a larger effect on the intensity and/or phase of the transmitted light. In other embodiments, the system 10 can have stacks of more than two cavities 22' and 22", separated by spacers, further reducing the surface movements of plates 30 required to generate a particular modulation of the transmitted light intensity.

As shown in FIG. 6, each pixel has a plate 30' on one side of a substrate 20 and a plate 30" on an opposite side of the substrate 20. The plate 30' may be coupled to the substrate 20 through one or more actuators 100, as shown above for FIG. 5, and the plate 30" may be similarly coupled to the substrate 20 through one or more actuators 100. For the same pixel, the cavity length between the plate 30' and substrate 20 may be different than the cavity length between the plate 30" and substrate 20. The movement of the plates 30 on each side of the substrate 20 allows modulation of the light transmitted through the pixel 12. The cavities 22 of the pixel 12 can be independently deformed such that the interference characteristics of one cavity 22' are different than the interference characteristics of the other cavity 22". The pixels 12 can be built into an array to create an interference-based transmissive spatial light modulator. In one embodiment, the pixels can be built into an array to create a transmissive spatial millimeter-wave modulator (SMWM). In another embodiment, the pixels can be formed into a pixelated array creating an array of mmW cavity etalons. In still other embodiments, the arrangement of FIG. 6 can function as band pass filter, a notch filter, or as a hologram. It is also possible to make the arrangement shown by FIG. 6 reflective by making the surface of the plate 30" reflective so that light for a given pixel only escapes the arrangement through the plate 30'.

In one embodiment, the system 10 can be used to generate an arbitrary wavefront output from a uniform wavefront input to the system 10. In another embodiment, the system 10 has the ability to cause variations in transmission properties in layers to create multiple reflections that can be adapted as may be desired.

Figure 7:
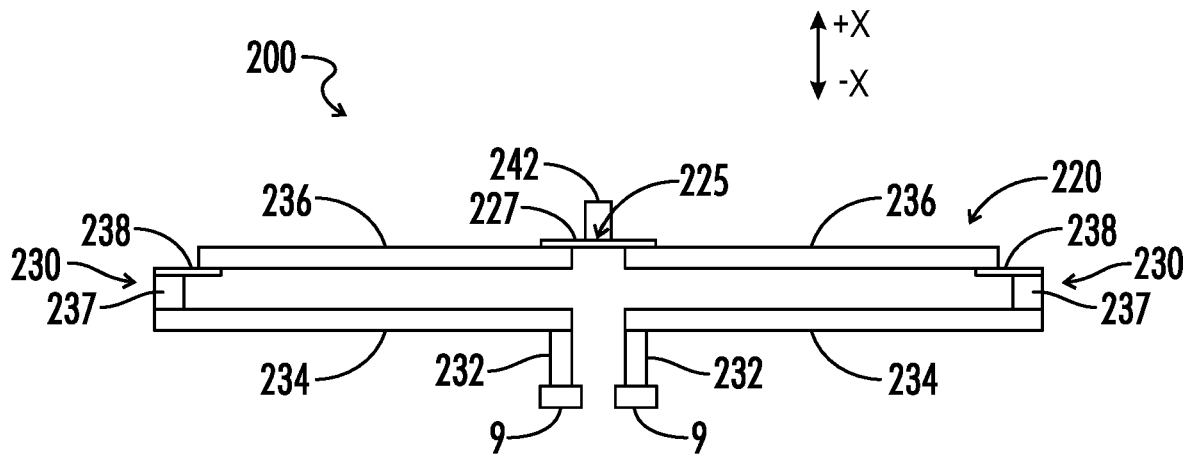
FIG. 7 depicts a perspective view of an embodiment of an actuator system.
Figure 8:
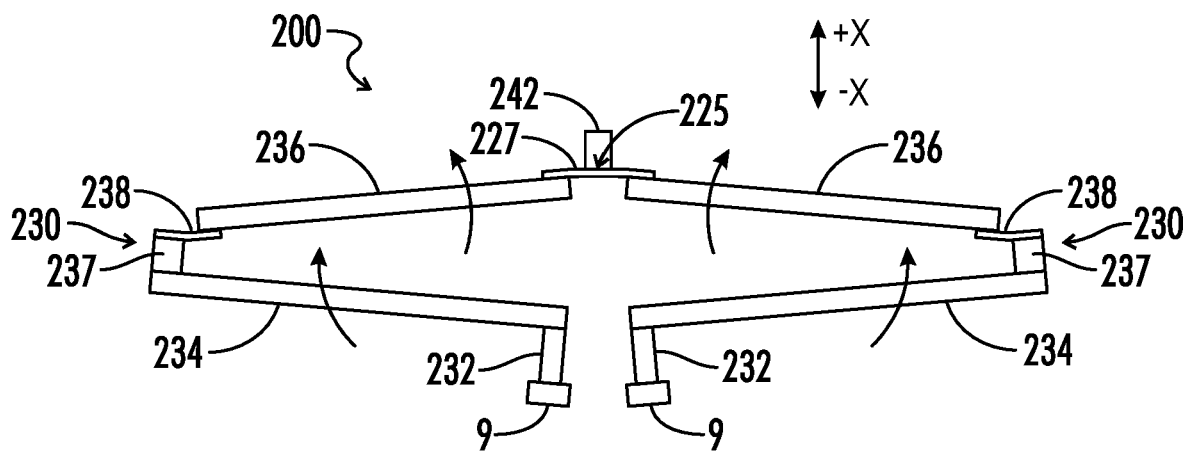
FIG. 8 depicts the actuator system of FIG. 7 after the arms of actuator system have been moved to a raised position.

FIGS. 7 and 8 illustrate portions of an actuator system 200. In one embodiment, the actuator system 200 can be used to implement any of the actuators 100 in the embodiments described above, but the actuator system 200 may be used with other devices in other embodiments, as may be desired. The actuator system 200 has two actuators 210 (FIG. 9) connected together by a frame 220. Each actuator 210 may be configured similar to actuators described in U.S. patent application Ser. No. 14/023,119. Note that, in FIGS. 7 and 8, only a torsion bar 9 of each actuator 210 is shown for simplicity of illustration. In other embodiments, more than two actuators 210 can be used in the actuator system 200.

A point 225 on the frame 220 that has the greatest linear movement in the X direction shall be referred to hereafter as the "max throw point." In the embodiment shown by FIG. 7, the max throw point 225 is aligned with the approximate center of the frame 220, but the max throw point 225 may be at other locations in other embodiments. The frame 220 can be connected to the object to be moved by the actuator system 200, e.g., plate 30. Connecting such object to the frame 220 at the max throw point 225 generally provides for the greatest movement of the object in the X direction.

As shown by FIG. 7, the frame 220 is connected to a torsion bar 9 of each of the actuators 210. As the torsion bars 9 are moved (e.g., twisted or otherwise rotated) by the actuators 210, the ends of the frame 220 at hinges 230 are moved in an arcuate motion, as will be described in more detail below. Such movement results in the linear movement of the point 225 of the frame in the X direction. For example, the movement of the ends of the frame 220 in an "upward" arcuate motion can result in an upward movement of the point 225 in the X direction and movement of the ends 230 in a "downward" arcuate motion can result in a downward movement of the point 225 in the—X direction.

In one embodiment, the frame 220 can mechanically amplify the movement of the torsion bars 9 of the actuators 210 to move the point 225 of the frame 220 a greater distance (relative to the substrate 20 for the actuators 210) than would be obtained from the movement of a torsion bar 9 in an actuator 210 without the use of a frame 220. In another embodiment, if the actuator system 200 is used in the systems 10 of FIGS. 2, 3 and 6, the operation of the frame 220 and the actuators 210 may be able to move the plate 30 a distance from the substrate 20 such that the pixel 12 can be used to modulate EMR having a wavelength in the millimeter range.

The frame 220 can include a pair of moment arms 232 that are connected to corresponding torsion bars 9 of the actuators 210. In other embodiments, more than one moment arm 232 can be connected to the torsion bar 9 of an actuator 210. Connected to each moment arm 210 is a corresponding connecting arm 234, referred to as "lower connecting arm" for simplicity of illustration, that extends from the moment arm 210 to a hinge 230 of the frame 220. In other embodiments, more than one lower connecting arm 234 can be connected to the moment arm 232. A corresponding connecting arm 236, referred to as "upper connecting arm" for simplicity of illustration, is connected to each respective lower connecting arm 234 at a respective hinge 230. Each hinge 230 connected between a pair of lower and upper connecting arms 234, 236 permits the upper connecting arm 236 to pivot or otherwise move with respect to the lower connecting arm 234.

In one embodiment, each hinge 230 comprises a support element 237 and a flexure 238 that is coupled to the support element 237. The flexure 238 may be composed of a pliable material that permits the flexure 238 to deform. When a moment arm 232 is rotated by an actuator 210, mechanical stresses in the frame 220 cause the upper connecting arm 236 to pivot relative to the lower connecting arm 234, as will be described in more detail below. The flexure 238 deforms to accommodate this movement, as shown by FIG. 8.

Note that the use of a hinge 230 is unnecessary. For example, in one embodiment, the upper connecting arm 236 can be "cold welded" or otherwise connected to the lower connecting arm 234 during fabrication without the use of a hinge 230. In such embodiment, deformation in the arms 234 and 236 may accommodate the movement of the upper connecting arm 236 relative to the lower connecting arm 234. Other techniques and mechanisms for connecting the lower connecting arm 234 and the upper connecting arm 236 can be used in other embodiments. In still other embodiments, more than one upper connecting arm 236 can be connected to a corresponding lower connecting arm 234.

The upper connecting arms 236 can be connected to one another. In one embodiment, the upper connecting arms 236 can be connected by a flexure 227 that enables the upper connecting arms 236 to move with respect to each other. The flexure 227 may be composed of a pliable material that permits the flexure 227 to deform. As each upper connecting arm 236 pivots about its respective hinge 230, the arms 236 move with respect to each other. The flexure 227 deforms in order to accommodate this movement. In this regard, the flexure 227 may function as a hinge. In other embodiments, the use of a flexure 227 is unnecessary, and it is possible for the arms 236 to deform in order to accommodate their respective movement. As an example, it is possible for one upper connecting arm 236 to be connected directly to the other arm 236. It is also possible for the arms 236 to be connected to each other by another type of a hinge. Yet other techniques and mechanisms for connecting the upper connecting arms 236 can be used in other embodiments.

In FIGS. 7 and 8, a support element 242, such as a post, is connected to the flexure 227 at the max throw point 225. Such support element 242 may be connected to the object to be moved (e.g., plate 30). Alternatively, the object to be moved may be connected directly to the flexure 227 or other portion of the frame 220.

As shown in FIGS. 7 and 8, rotational movement of the torsion bar 9 of the actuator 210 results in the raising (see FIG. 8) and lowering (see FIG. 7) of the point 225 of the frame 220. The torsion bars 9, moment arms 232, and the lower and upper connecting arms 234, 236 work collectively to convert the rotational motion of the torsion bars 9 into linear movement of the point 225 of the frame 220. When upward movement of the point 225 is desired, the torsion bars 9 are controlled such that they rotate in a direction that moves the lower connecting arms 234 upward. For example, noting that FIG. 7 shows the actuator system 200 before such movement, the torsion bars 9 may rotate under the control of a controller (not shown in FIG. 7) such that the right moment arm 232 is rotated counter-clockwise and the left moment arm 232 is rotated clockwise. Such movement causes each lower connecting arm 234 to pivot about the contact point between the arm 234 and its respective torsion bar 9 such that the end of the arm 234 connected to its corresponding hinge 230 is moved upward, as shown by FIG. 8. This action tends to force the upper connecting arm 236 together. However, the coupling between the upper connecting arms 236 (e.g., the flexure 227 in the embodiment shown by FIGS. 7 and 8) resists such motion causing mechanical stresses that force the upper connecting arms 236 to pivot. Specifically, each upper connecting arm 236 pivots about its respective hinge 230 such that the end of such arm 236 connected to the flexure 227 is forced upward, as shown by FIG. 8, thereby moving the max throw point 225 in the X direction. That is, in response to rotation of the torsion bars 9, the connecting arms 234, 236 open in a scissor-like manner in order to move the max throw point 225 upward. As described above, the flexure 227 is sufficiently pliable in order to deform for accommodating the movement of one upper connecting arm 236 relative to the other connecting arm 236 as they pivot.

Due to the lengths of the lower and upper connecting arms 234, 236, relatively small movements of the torsion bars 9 translate into much larger linear movement of the point 225. In general, longer arms 234, 236 result in greater movement of the point 225. In addition, it is possible to connect more connecting arms to achieve yet more movement of the point 225 or other point of the frame 220.

When the torsion bars 9 rotate in corresponding directions that move the lower connecting arms 234 downward (i.e., opposite to the directions described above), each lower connecting arm 234 pivots about the contact point between the arm 234 and its respective torsion bar 9 such that the end of the arm 234 connected to the hinge 230 is moved downward. This action tends to relieve the stresses that caused upward movement of the point 225, as described above, so that the upper connecting arms 236 are allowed to pivot about hinges 230 in the opposite direction relative to the example described above. Thus, the ends of the upper connecting arms 236 coupled to the flexure 227 are permitted to move downward thereby lowering the point 225 (in the —X direction). Eventually, the frame 220 may return to the state shown by FIG. 7.

Figure 9:
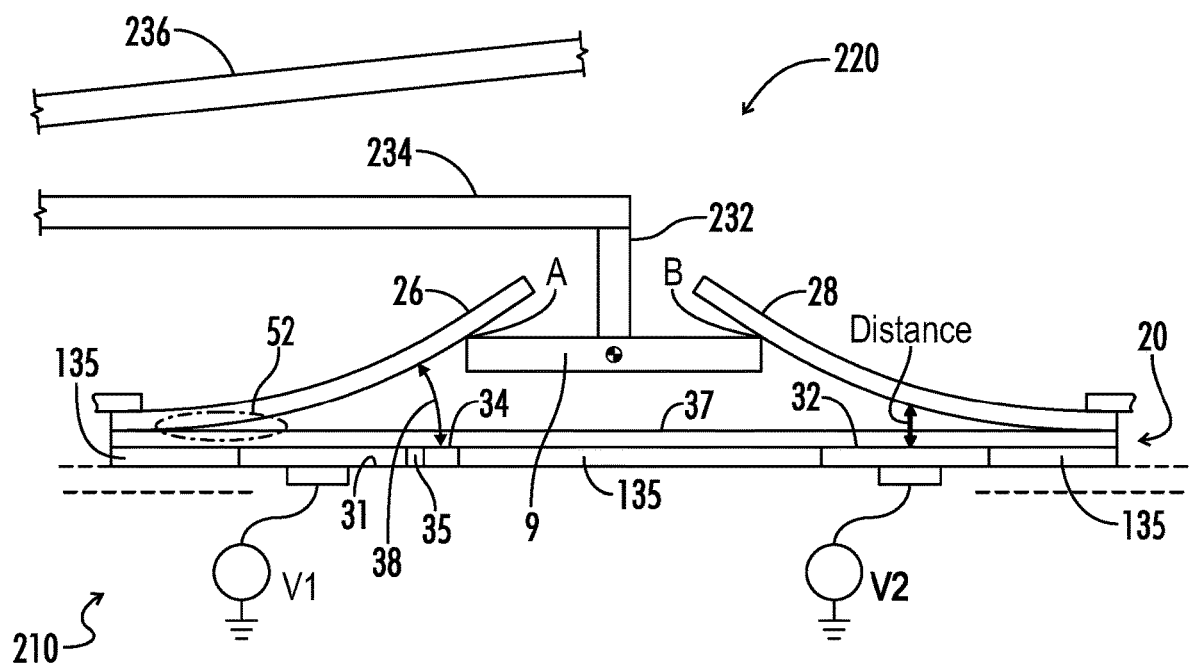
FIG. 9 depicts a partial view of an actuator and frame from the actuator system of FIG. 7.

FIG. 9 shows a partial view of an actuator 210 and the frame 220 from the actuator system 200. The torsion bar 9 of actuator 210 can rest on support posts (not shown) and contact a pair of force ribbons 26, 28. In one embodiment the torsion bar 9 can have a rectangular or cross shape. In other embodiments, the torsion bar 9 may have other shapes and configurations. At least one end of each force ribbon 26, 28 is attached to a substrate 20. The force ribbons 26, 28 can apply forces to the edges (A, B) of the torsion bar 9 to rotate the torsion bar 9. When a force is applied by a force ribbon 26, 28 to an edge (A, B) of the torsion bar 9, the torsion bar 9 rotates from its neutral position (as shown in FIGS. 7 and 9) to a new position (see e.g., FIG. 8) based on the magnitude and direction of the applied force. The rotation of the torsion bar 9 from its neutral position may be in the clockwise or the counterclockwise direction (about its axis of rotation) depending on a control signal. The electric field and resulting forces created by the control signal may have time-varying components. If the forces of the ribbon force 26, 28 are removed, such as when control signal voltage goes to zero, a restoring force based on Hooke's law tends to move the torsion bar 9 back to its neutral position. As would be understood by those skilled in the art, the ends of the torsion bar 9 attached to the support posts do not rotate causing the torsion bar 9 to twist during rotation. The torsional forces generated by the twisting tend to return the torsion bar 9 back to its neutral position when electrostatic forces are removed. In other embodiments, other types of drive bars 9 are possible, such as, for example, a cantilevered beam.

The force ribbons 26, 28 are made of a conductive material enabling all portions of the force ribbons 26, 28 to have approximately the same electrical potential. The first force ribbon 26 is adjacent to control plate 31 as shown on the left side of FIG. 9, and the second force ribbon 28 is adjacent to control plate 32 as shown on the right side of FIG. 9. Insulators 135 are positioned between the control plates 31, 32 and a capacitor plate 34, as shown by FIG. 9. An insulator 37 prevents the force ribbons 26, 28 from making electrical contact with their respective control plates 31, 32. For the embodiment depicted in FIG. 9, the two force ribbons 26, 28 each have one end resting on the substrate 20 and the other end resting on a respective edge (A, B) of torsion bar 9.

A control signal has a first voltage, V1(t), coupled to the first control plate 31, and the control signal has a second voltage, V2(t), coupled to the second control plate 32. When V1(t) has a potential greater than zero volts, for example a few volts, then an electric field is created between the first control plate 31 and the first force ribbon 26, which results in the ribbon 26 moving toward the control plate 31 and insulator 37 (based on attraction forces in region 52), thereby causing the ribbon 26 to apply a force on an edge (A) of the torsion bar 9 that rotates the torsion bar 9. The electrostatic and stiction forces acting on the force ribbon 26 cause it to press on an edge (A) of torsion bar 9 resulting in the counterclockwise rotation of the torsion bar 9. As the torsion bar 9 rotates and the force ribbon 26 moves closer to the insulator 37, the distance 38 of the force ribbon 26 from the capacitor plate 34 decreases thereby changing the capacitance between the force ribbon 26 and the capacitor plate 34. The force ribbon 28 may be similarly used to apply forces on the torsion bar 9 for rotating it in a desired manner. In this regard, if the control signal applies a non-zero potential for V2(t) to the second control plate 32, an attractive force is created between the ribbon 28 and the control plate 32. Additional information regarding the operation of the actuator 210 is described in U.S. patent application Ser. No. 14/023,119, entitled "Spatial Light Modulator for Actuating Microelectromechanical Systems (MEMS) Structures" and filed on Sep. 10, 2013, which application is incorporated herein by reference. In one embodiment, the actuators 210 and the frames 220 can be microfabricated in accordance with known microfabrication techniques and are microelectromechanical systems (MEMS) structures that can be batch fabricated.

In various embodiments described above, actuators 210 and frame 220 are used in a spatial light modulator system. However, it is possible for the actuators 210 and frame 220 to be used in other applications including other types of microfabricated systems for controlling the movement of components of such systems in a desired manner. The actuators 210 and frame 220 of the present disclosure are capable of providing movement greater than 10 microns.

Although the present disclosure has been described above in terms of specific embodiments, it is anticipated that alterations and modifications thereof will become apparent to those skilled in the art. It is therefore intended that the following claims be interpreted as covering all such alterations and modifications as fall within the spirit and scope of the disclosure.

Now, therefore, the following is claimed:

1. An actuator system for a component of a spatial light modulator, the actuator system comprising:
    a first actuator;
    a second actuator;
    a frame coupled to the first actuator and the second actuator, the frame having a portion coupled to the component of the spatial light modulator, the frame configured to move the portion in a linear direction, thereby moving the spatial light modulator in the linear direction, in response to rotational movement of the first actuator and the second actuator, wherein the rotational movement of the first actuator and the rotational movement of the second actuator are in opposite directions.

2. The actuator system of claim 1, wherein the first actuator comprises a first torsion bar, wherein the second actuator comprises a second torsion bar, wherein the rotational movement of the first actuator is by the first torsion bar, and wherein the rotational movement of the second actuator is by the second torsion bar.

3. The actuator system of claim 1, wherein the frame comprises a pair of connecting arms coupled to the portion.

4. The actuator system of claim 3, wherein the frame further comprises a hinge connecting the pair of connecting arms.

5. The actuator system of claim 2, wherein the frame further comprises:
    a first moment arm connected to the first torsion bar;
    a second moment arm connected to the second torsion bar;
    a connecting arm connected to the first moment arm and the second moment arm, the connecting arm including the portion; and
    wherein the connecting arm is configured to move the portion in response to movements of the first moment arm by the first torsion bar and movements of the second moment arm by the second torsion bar.

6. The actuator system of claim 1, wherein the frame is configured to move the portion in response to rotational movements of corresponding ends of the frame.

* * * * *